(12) United States Patent
Doll et al.

(10) Patent No.: US 10,612,123 B2
(45) Date of Patent: Apr. 7, 2020

(54) DUPLEX SURFACE TREATMENT FOR TITANIUM ALLOYS

(71) Applicant: The University of Akron, Akron, OH (US)

(72) Inventors: Gary L. Doll, North Canton, OH (US); Benjamin M. McMillen, Akron, OH (US)

(73) Assignees: THE UNIVERSITY OF AKRON, Akron, OH (US); AKRON RESEARCH AND TECHNOLOGY, Akron, OH (US)

( * ) Notice: Subject to any disclaimer, the term of this patent is extended or adjusted under 35 U.S.C. 154(b) by 227 days.

(21) Appl. No.: 15/548,157

(22) PCT Filed: Feb. 4, 2016

(86) PCT No.: PCT/US2016/016526
§ 371 (c)(1),
(2) Date: Aug. 2, 2017

(87) PCT Pub. No.: WO2016/126917
PCT Pub. Date: Aug. 11, 2016

(65) Prior Publication Data
US 2018/0010229 A1 Jan. 11, 2018

Related U.S. Application Data

(60) Provisional application No. 62/111,880, filed on Feb. 4, 2015.

(51) Int. Cl.
*C23C 8/24* (2006.01)
*C22F 1/18* (2006.01)
(Continued)

(52) U.S. Cl.
CPC .............. *C23C 8/24* (2013.01); *C22C 14/00* (2013.01); *C22F 1/002* (2013.01); *C22F 1/183* (2013.01);
(Continued)

(58) Field of Classification Search
USPC .... 427/419.1, 49.7, 577; 428/217, 336, 408, 428/457, 698; 148/206, 237
See application file for complete search history.

(56) References Cited

U.S. PATENT DOCUMENTS 2,804,410 A * 8/1957 Wyatt ................ C23C 8/24
148/237
4,902,535 A * 2/1990 Garg .................. C23C 16/0281
427/419.7
(Continued)

FOREIGN PATENT DOCUMENTS

CN 101532122 * 9/2009
EP 1154034 * 11/2001
(Continued)

OTHER PUBLICATIONS

Yetim et al "improving tribological properties of Ti6Al$V allloy with duyplex surfae treatment " Surface & Coatings Technology 205 p. 320-324. (Year: 2010).*
(Continued)

*Primary Examiner* — Archene A Turner
(74) *Attorney, Agent, or Firm* — Renner Kenner Greive Bobak Taylor & Weber

(57) ABSTRACT

A surface treatment for a metal substrate includes a nitride layer and a diamond-like carbon coating on said nitride layer. The metal substrate can be a titanium-containing substrate. The nitride layer and diamond-like carbon coating serve to improve the tribological properties of the metal substrate.

18 Claims, 2 Drawing Sheets

(51) Int. Cl.
*C23C 28/04* (2006.01)
*C23C 8/36* (2006.01)
*C22C 14/00* (2006.01)
*C22F 1/00* (2006.01)
*C23C 14/06* (2006.01)
*C23C 16/27* (2006.01)

(52) U.S. Cl.
CPC ............ *C23C 8/36* (2013.01); *C23C 14/0611* (2013.01); *C23C 16/27* (2013.01); *C23C 28/042* (2013.01); *C23C 28/046* (2013.01)

(56) References Cited

U.S. PATENT DOCUMENTS

| | | | | |
|---|---|---|---|---|
| 5,443,663 | A * | 8/1995 | Meletis | C23C 8/24 427/248.1 |
| 5,688,557 | A * | 11/1997 | Lemelson | A61F 2/30767 427/577 |
| 6,231,956 | B1 * | 5/2001 | Brenner | C23C 28/347 428/457 |
| 6,410,125 | B1 * | 6/2002 | Brenner | C23C 8/24 427/577 |
| 6,740,393 | B1 * | 5/2004 | Massler | C23C 16/029 428/336 |
| 8,220,489 | B2 * | 7/2012 | Brondum | F16K 11/0655 137/625.17 |
| 8,663,814 | B2 | 3/2014 | Eichmann et al. | |
| 2004/0197581 | A1 * | 10/2004 | Berglund | C22C 38/001 428/408 |
| 2005/0130793 | A1 | 6/2005 | Doll et al. | |
| 2007/0098993 | A1 | 5/2007 | Chen | |
| 2007/0111003 | A1 | 5/2007 | Chen | |
| 2007/0254187 | A1 * | 11/2007 | Yamamoto | C23C 14/022 428/698 |
| 2007/0284255 | A1 | 12/2007 | Gorokhovsky et al. | |
| 2009/0246243 | A1 | 10/2009 | Martinu et al. | |
| 2009/0309277 | A1 | 12/2009 | Jones | |

FOREIGN PATENT DOCUMENTS

EP 1698713 * 9/2006
WO 19950331584 A1 11/1995

OTHER PUBLICATIONS

Liu et al "Tribological behaviour of DLC coatings with functionally gradient interfaces" Surface & Coatings Technology 153 p. 178-183. (Year: 2002).*

Meletis et al "Tribological characterestics of DLC films and duplex plasma nitrding/DLC coating treatments" Surface & Coatings Technology 73 p. 39-45 (Year: 1995).*

Advanced Heat Treat Corp., "UitraGiow Gas Nitriding" Dec. 2014 (online) [retrieved on Apr. 13, 2016]. RP.IriAvl;'d frorn lh8 Internet URL: http://web.archive.org/web/20 1412081801 0 1/http://www.ahtweb.comlservices/ultraglowreg-ionnitriding.aspx>.

Advanced Heat Trent Corp., "UitraGlow Ion Nitriding" Dec. 2014 [online] [retrieved on Apr. 13, 2016]. Retrieved from the Internet <URL:http://web.archive.org/wcb/20 1412001 G 1828/lottp://www.ahtweb.com/services/ultraglow-gasnitriding.aspx>.

* cited by examiner

DUPLEX SURFACE TREATMENT FOR TITANIUM ALLOYS

CROSS-REFERENCE TO RELATED APPLICATION

This application claims priority to U.S. Provisional Patent Application No. 62/111,880 filed on Feb. 4, 2015, the contents of which are incorporated herein by reference.

FIELD OF THE INVENTION

The present invention generally relates to a surface treatment for a metal component and associated methods of preparing the surface treatment. The present invention further relates to a surface treatment comprising a nitride layer and a diamond-like carbon coating layer applied to a titanium-containing substrate.

BACKGROUND OF THE INVENTION

Attempts have been made to reduce the weight, increase the rate of fire, and reduce the recoil impact force of firearms. For example, certain steel components have been replaced with those made from titanium alloys. However, titanium alloys have poor wear resistance. Therefore, coatings and surface treatments are often applied to components made from titanium alloys to improve their wear resistance and to reduce their friction coefficients. However, there remains a need in the art for improved surface treatments.

SUMMARY OF THE INVENTION

A first embodiment provides a surface treatment for a titanium-containing substrate comprising a nitride layer and a diamond-like carbon coating on said nitride layer.

A second embodiment provides a surface treatment as in the first embodiment, wherein said nitride layer has a thickness of from 3 to 15 nm.

A third embodiment provides a surface treatment as in the either the first or second embodiment, wherein said nitride layer has a hardness of from 300 HV to 1800 HV.

A fourth embodiment provides a surface treatment as in any of the first through third embodiments, wherein said nitride layer has a hardness of 700 HV or more.

A fifth embodiment provides a surface treatment as in any of the first through fourth embodiments, wherein said diamond-like carbon coating includes a gradient layer between an adhesion layer and a top functional layer, said adhesion layer being proximate said nitride layer.

A sixth embodiment provides a surface treatment as in any of the first through fifth embodiments, wherein said diamond-like carbon coating has a hardness of 9 GPa or more.

A seventh embodiment provides a coated metal substrate comprising a titanium-containing substrate having a nitride layer, and a diamond-like carbon coating on top of said nitride layer.

An eighth embodiment provides a coated metal substrate as in the seventh embodiment, wherein said titanium-containing substrate includes 50 wt. % or more titanium.

A ninth embodiment provides a coated metal substrate as in either the seventh or eighth embodiments, wherein said titanium-containing substrate includes 80 wt. % or more titanium.

A tenth embodiment provides a coated metal substrate as in any of the seventh through ninth embodiments, wherein said titanium-containing substrate is a nickel titanium alloy.

An eleventh embodiment provides a coated metal substrate as in any of the seventh through tenth embodiments, wherein said titanium-containing substrate is represented by the formula $Ni_xTi_{1-x}$, where x is in a range of from 30 to 70.

A twelfth embodiment provides a coated metal substrate as in any of the seventh through eleventh embodiments, wherein x is in a range of from 35 to 50.

A thirteenth embodiment provides a coated metal substrate as in any of the seventh through twelfth embodiments, wherein said titanium-containing substrate is selected from the group consisting of a slide in a bolt carrier, a knee replacement part, a hip replacement part, a gear, a crankshaft, a knife, and shears.

A fourteenth embodiment provides a coated metal substrate as in any of the seventh through thirteenth embodiments, wherein said titanium-containing substrate is selected from the group consisting of gun components and medical devices.

A fifteenth embodiment provides a method of making the coated metal substrate of any of the seventh through fourteenth embodiments comprising the steps of providing a titanium-containing substrate, introducing nitrogen to the titanium-containing substrate to thereby form a nitride layer within the titanium-containing substrate, and applying a diamond-like carbon coating to the nitride layer.

A sixteenth embodiment provides a method as in the fifteenth embodiment, further comprising the steps of placing the titanium-containing substrate in a furnace, reducing the pressure of the furnace, and increasing the temperature of the furnace to a treating temperature.

A seventeenth embodiment provides a method as in the either the fifteenth or sixteenth embodiment, further comprising the step of holding the temperature of the furnace at the treating temperature.

An eighteenth embodiment provides a method as in any of the fifteenth through seventeenth embodiments, further comprising the step of quenching the titanium-containing substrate with a nitrogen gas backfill.

A nineteenth embodiment provides a method as in any of the fifteenth through eighteenth embodiments, further comprising the step of removing a contamination layer from the titanium-containing substrate.

A twentieth embodiment provides a method as in any of the fifteenth through nineteenth embodiments, wherein said step of removing a contamination layer includes providing a nitrogen gas flow to the titanium-containing substrate while heating the furnace to the treatment temperature.

BRIEF DESCRIPTION OF THE DRAWINGS

Advantages of the present invention will become better understood with regard to the following description, appended claims, and accompanying drawings wherein:

DETAILED DESCRIPTION OF ILLUSTRATIVE EMBODIMENTS

Figure 1:
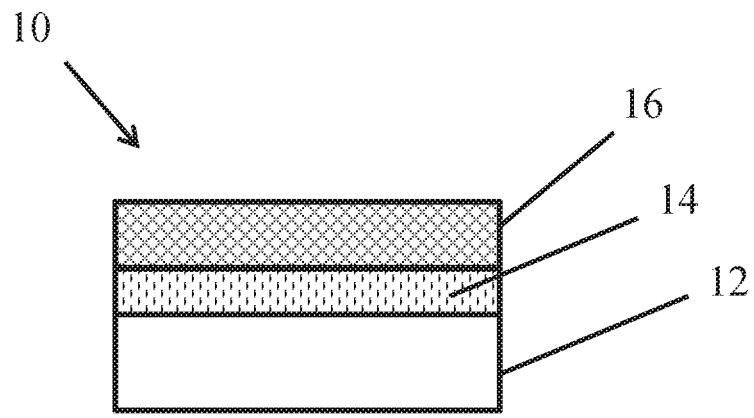
FIG. 1 is a schematic cross-sectional view of a treated metal component with a nitride layer and diamond-like carbon coating on one surface.

With reference to FIG. 1, a surface treated metal component 10 includes a metal substrate 12 having a nitride layer 14. In one or more embodiments, nitride layer 14 is formed by providing nitrogen gas to metal substrate 12. Thus, it can be said that nitride layer 14 exists within metal substrate 12. It might also be described that nitride layer 14 is positioned on metal substrate 12.

Component 10 further includes a diamond-like carbon coating 16 in proximity to nitride layer 14. It can also be said that diamond-like carbon coating 16 is applied to nitride layer 14 or positioned on nitride layer 14. Nitride layer 14 and diamond-like carbon coating 16 serve to improve the tribological properties of metal substrate 12.

Figure 2:
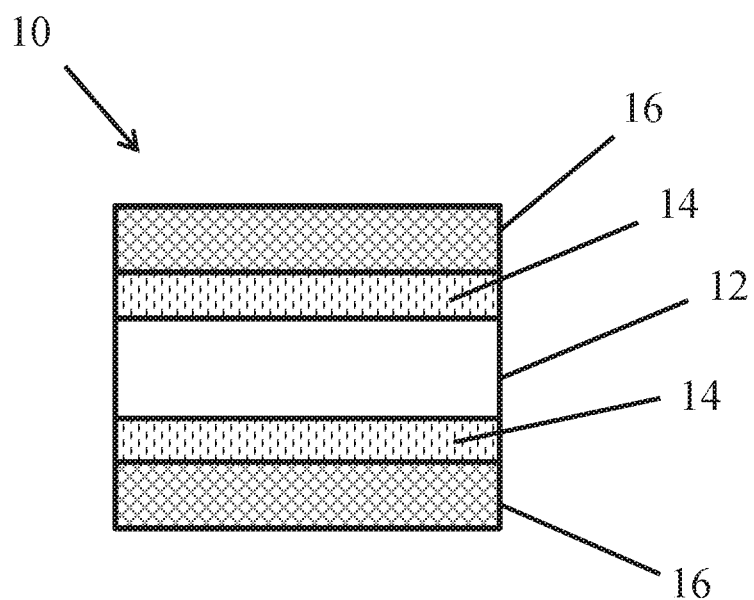
FIG. 2 is a schematic cross-sectional view of a treated metal component with the nitride layer and diamond-like coating applied to two surfaces.
Figure 4:
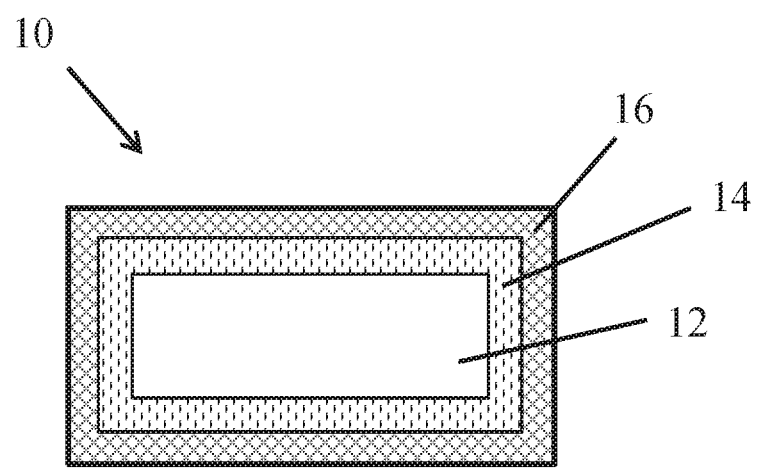
FIG. 4 is a schematic cross-sectional view of a treated metal component with a nitride layer and diamond-like carbon coating applied to all surfaces.

In one or more embodiments, as shown in FIG. 1, nitride layer 14 and coating 16 are applied only to an outermost surface of metal substrate 12. In one or more embodiments, as shown in FIG. 2, nitride layer 14 and coating 16 are applied to just the top and bottom surfaces of metal substrate 12. In one or more embodiments, as shown in FIG. 4, nitride layer 14 and coating 16 are applied to all outermost surfaces of metal substrate 12. Since FIG. 4 is a cross-sectional view, it should be appreciated that the front and rear surfaces of substrate 12 can be coated in one or more embodiments.

In one or more embodiments, metal substrate 12 contains titanium. In these embodiments, metal substrate 12 can also be referred to as a titanium-containing substrate, a titanium alloy substrate, a titanium-containing alloy, or a titanium alloy. Titanium-containing alloys are metals that contain a mixture of titanium and other chemical elements. Such alloys have very high tensile strength and toughness, even at extreme temperatures. They have a high strength to weight ratio, extraordinary corrosion resistance, and the ability to withstand extreme temperatures.

Metal substrate 12 can be characterized by the weight amount of the metals contained therein. In one or more embodiments, metal substrate 12 includes from 10 wt. % to 100 wt. % titanium, in other embodiments, from 50 wt. % to 90 wt. % titanium, and in other embodiments, from 60 wt. % to 80 wt. % titanium. In one or more embodiments, metal substrate 12 includes 10 wt. % or more titanium, in other embodiments, 50 wt. % or more titanium, and in other embodiments, 80 wt. % or more titanium. In one or more embodiments, metal substrate 12 includes 90 wt. % or less titanium, in other embodiments, 60 wt. % or less titanium, and in other embodiments, 30 wt. % or less titanium.

In one or more embodiments, metal substrate 12 includes from 10 wt. % to 100 wt. % magnesium, in other embodiments, from 50 wt. % to 90 wt. % magnesium, and in other embodiments, from 60 wt. % to 80 wt. % magnesium. In one or more embodiments, metal substrate 12 includes 10 wt. % or more magnesium, in other embodiments, 50 wt. % or more magnesium, and in other embodiments, 80 wt. % or more magnesium. In one or more embodiments, metal substrate 12 includes 20 wt. % or less magnesium, in other embodiments, 40 wt. % or less magnesium, and in other embodiments, 60 wt. % or less magnesium.

In one or more embodiments, metal substrate 12 includes from 10 wt. % to 100 wt. % aluminum, in other embodiments, from 50 wt. % to 90 wt. % aluminum, and in other embodiments, from 60 wt. % to 80 wt. % aluminum. In one or more embodiments, metal substrate 12 includes 10 wt. % or more aluminum, in other embodiments, 50 wt. % or more aluminum, and in other embodiments, 80 wt. % or more aluminum. In one or more embodiments, metal substrate 12 includes 20 wt. % or less aluminum, in other embodiments, 40 wt. % or less aluminum, and in other embodiments, 60 wt. % or less aluminum.

In one or more embodiments, metal substrate 12 is made from titanium and nickel. These can also be referred to as nickel titanium alloys or nitinol. In these embodiments, the nickel and titanium can be provided based on the general formula $Ni_xTi_{1-x}$, where the subscripts represent the ratio amount of each element. In one or more embodiments, x is in a range of from 0.30 to 0.70, in other embodiments x is in a range of from 0.35 to 0.55, and in other embodiments x is in a range of from 0.40 to 0.50. In one or more embodiments, x is 0.45 or approximate thereto, and in other embodiments, x is 0.40 or approximate thereto. In one or more embodiments, x is less than 0.70, in other embodiments x is less than 0.50, and in other embodiments x is less than 0.40. In one or more embodiments, metal substrate 12 is made from substantially only titanium and nickel.

Exemplary metal substrates 12 include machine components, gun components, medical devices, aircraft components, tools, and automotive components. In one or more embodiments, metal substrate 12 can be selected from the group consisting of a slide in a bolt carrier (gun components), a knee replacement part, a hip replacement part (medical devices), gears, crankshafts (aircraft components and automotive components), knives, and shears (tools).

Nitride layer 14 forms a part of metal substrate 12 based on a reaction between the titanium in metal substrate 12 and nitrogen gas ($N_2$) supplied to metal substrate 12. Thus, a layer of metal substrate 12 near the surface is converted to a layer 14 of nitrided titanium. Nitrided titanium is extremely hard, and is resistant to wear and corrosion, with good friction properties.

In one or more embodiments, nitride layer 14 has a thickness of 8 μm, or approximate thereto. In one or more embodiments, nitride layer 14 has a thickness of from 3 to 15 μm, in other embodiments, from 5 to 12 μm, and in other embodiments, from 7 to 10 μm. In one or more embodiments, nitride layer 14 has a thickness of 3 μm or more, in other embodiments 5 μm or more, and in other embodiments 7 μm or more. In one or more embodiments, nitride layer 14 has a thickness of 15 μm or less, in other embodiments 12 μm or less, and in other embodiments 10 μm or less. The thickness of nitride layer 14 can be adjusted based on how long metal substrate 12 is treated with nitrogen, and at what temperature the nitrogen treatment occurs.

By nitriding the layer 14, this layer will have a higher hardness than the remainder of metal substrate 12. In one or more embodiments, nitride layer 14 has a hardness of from 300 HV to 1800 HV, in other embodiments, from 500 HV to 900 HV, and in other embodiments, from 700 HV to 1800 HV. In one or more embodiments, nitride layer 14 has a hardness of 500 HV or more, in other embodiments 700 HV or more, and in other embodiments 900 HV or more. In one or more embodiments, nitride layer 14 has a hardness of 1200 HV or less, in other embodiments 1000 HV or less, and in other embodiments 800 HV or less.

One or more methods of forming nitride layer 14 are generally known to those skilled in the art or may become known to those skilled in the art. In general, a nitrided titanium surface layer 14 is imparted to a metal substrate 12. These methods include pulsed plasma nitriding, salt bath nitriding, and gas nitriding. One or more aspects of nitride layer 14 and associated methods of forming nitride layer 14 may be disclosed in U.S. Pat. Nos. 2,804,410; 3,677,832; 5,320,686; 5,443,663; 5,961,792; and 8,203,095, which are all incorporated herein by reference.

In one or more embodiments, a method of forming nitride layer 14 includes one or more of the following steps: placing a metal substrate in a high temperature furnace, providing nitrogen gas to the metal substrate, reducing the pressure of the furnace, ramping the temperature of the furnace to a treating temperature, holding the temperature of the furnace, and quenching the metal substrate with a nitrogen gas backfill.

In one or more embodiments, the nitrogen gas is provided as a partial pressure with other gases. In one or more embodiments, a gas containing only nitrogen gas is provided. In one or more embodiments, the pressure of a furnace is reduced to $5 \times 10^{-4}$ Torr or approximate thereto. In one or more embodiments, the pressure of a furnace is reduced to below $5 \times 10^{-4}$ Torr, in other embodiments below $1 \times 10^{-4}$ Torr. In one or more embodiments, the pressure is reduced to a vacuum.

In one or more embodiments, the treating temperature is 800° C. or approximate thereto. In one or more embodiments, the treating temperature is in a range of from 700° C. to 900° C. In one or more embodiments, the treating temperature is 700° C. or more, in other embodiments 800° C. or more, and in other embodiments 900° C. or more. In one or more embodiments, the treating temperature is 1000° C. or less, in other embodiments 900° C. or less, and in other embodiments 800° C. or less. In one or more embodiments, the furnace is held at the treating temperature for two hours. In one or more embodiments, the furnace is held at the treating temperature for two hours or more. In one or more embodiments, the furnace is held at the treating temperature in a range of from 1.5 hours and 3 hours.

Prior to forming nitride layer 14, metal substrate 12 will have a contamination layer that will need to be removed. The contamination layer is a layer of having a thickness of a few atoms and includes absorbed carbon and oxygen, and potentially other impurities. These contamination layers exist on nearly all untreated surfaces. To remove the contamination layer, a nitrogen gas flow is provided to metal substrate 12 while heating the furnace to the treatment temperature.

Providing a sufficient nitrogen gas flow while heating to the treatment temperature causes the contamination layer to desorb during the heating step. This prevents the contaminants from reacting with the metal substrate 12, which would result in a diffusion barrier. If a diffusion barrier were to form, it would be difficult, or not possible, to form a nitride layer 14 of sufficient thickness.

Diamond-like carbon coating 16 is an amorphous carbon or hydrocarbon based thin film, tribological coating. The coating 16 is applied to the nitride layer 14, or layers, of metal substrate 12. Preferably, the coating 16 is applied to the entire surface of the nitride layer 14.

One or more methods of depositing diamond-like carbon coating 16 are generally known to those skilled in the art or may become known to those skilled in the art. For example, coating 16 can be deposited using generally known plasma techniques for vapor deposition. Examples of vapor deposition include physical vapor deposition (PVD) and plasma-enhanced chemical vapor deposition (PECVD). As is generally known by one skilled in the art, the gradient layers can be formed by changing the ratio of components that are being coated onto the substrate. Thus, there is no sharp line separation between adjacent layers.

Figure 3:
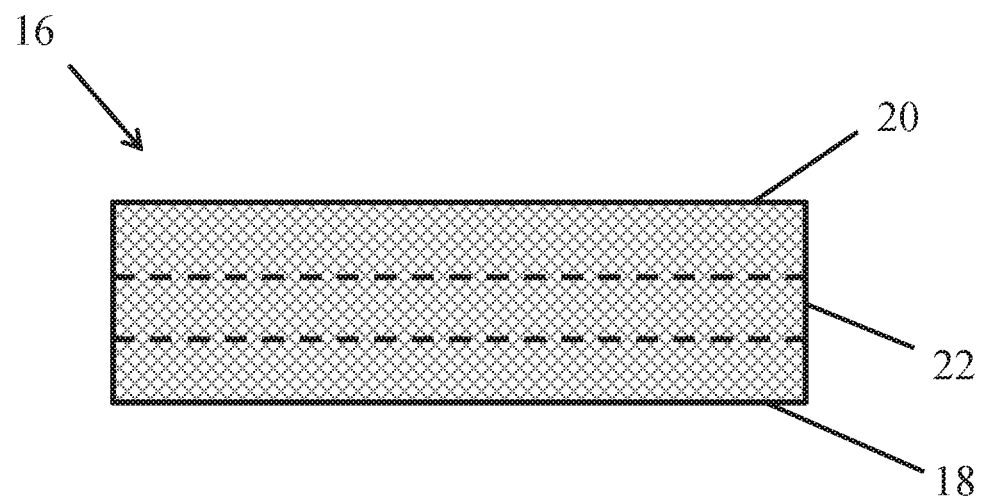
FIG. 3 is a schematic cross-sectional view of the layers of a diamond-like carbon coating.

Although it is amorphous carbon or hydrocarbon based, coating 16 can be reinforced with additional elements such as titanium (Ti), tungsten (W), chromium (Cr), tantalum (Ta), silicon (Si), vanadium (V), nickel (Ni), niobium (Nb), iron (Fe) or zirconium (Zr) or carbidic inclusions thereof. With reference to FIG. 3, coating 16 comprises at least two layers: an adhesive layer 18, which can also be referred to as an interlayer 18, is applied to the substrate 12, and a top functional layer 20 covers the adhesion layer 18.

The adhesion layer 18 can be made from chromium (Cr), titanium (Ti), tantalum (Ta), nickel (Ni), molybdenum (Mo), iron (Fe), silicon (Si), and combinations thereof. In one or more embodiments, adhesion layer 18 is made from a dominant element. For example, in one or more embodiments, adhesion layer 18 is made from only atomic chromium. In one or more embodiments, adhesion layer 18 is made from chromium and titanium. In one or more embodiments, adhesion layer 18 includes one or more other elements selected from the group consisting of carbon (C), hydrogen (H), oxygen (O) and combinations thereof.

The top functional layer 20 may further include the elements oxygen (O), nitrogen (N), boron (B), fluorine (F), and combinations thereof. The top functional layer 20 may also be referred to as a hard carbonaceous top layer 20, and may include one or more of the additive elements noted above (i.e. Ti, W, Cr, Ta, Si, V, Nb, Zr, Mo, O, N, B, and F). In one or more embodiments, the amount of one or more additive elements is less than 50 atomic % of the total top layer 20 composition, in other embodiments less than 30 atomic % of the total top layer 20 composition, with the balance of the top layer 20 composition being carbon and hydrogen. It is also possible for the carbonaceous functional top layer 20 to have no additives and consist of only amorphous carbon (C) or amorphous hydrocarbon (C and H). In embodiments where top layer 20 is an amorphous hydrocarbon, the C:H ratio should be greater than or equal to 50%.

In one or more embodiments, one or more gradient layers 22 can be present between the adhesion layer 18 and the top functional layer 20. Where present, the one or more gradient layers 22 serves as a transition layer and includes a compositional gradient that transforms from the composition of the adhesion layer 18 to the composition of the top functional layer 20. In one or more embodiments, a gradient layer 22 is made from tungsten (W) and amorphous hydrocarbon (a-C:H).

In one or more embodiments, two gradient layers 22 are present. In one such embodiment, the adhesion layer 18 is made from Cr, the first gradient layer is made from Cr/WC/a-C:H, the second gradient layer (not shown) is made from WC/a-C:H, and the top layer 20 is made from a-C:H. In this embodiment, the first gradient layer 22 includes a compositional gradient that will transform from being chromium adjacent the adhesive layer 18, to being WC/a-C:H adjacent the second gradient layer. The second gradient layer includes a compositional gradient that will transform from being WC/a-C:H adjacent the first gradient layer 22, to being a-C:H adjacent the top functional layer.

In one or more embodiments, the coating 16 is a tungsten carbide-reinforced amorphous hydrocarbon nano-composite coating. One commercially made coating 16 is a WC/aC:H coating available from The Timken Company under the name ES300.

In one or more embodiments, the coating 16 has a thickness of less than 10 micrometers, in other embodiments less than 8 micrometers, and in other embodiments less than 4 micrometers. In one or more embodiments, the coating 16 has a thickness of 3 micrometers or approximate thereto. In one or more embodiments, the coating 16 has a thickness of from 1 micrometer to 4 micrometers, in other embodiments, from 1 micrometer to 10 micrometers, in other embodiments, from 7 micrometers to 10 micrometers, and in other embodiments, from 4 micrometers to 8 micrometers.

In one or more embodiments, adhesion layer 18 has a thickness of less than 200 nm, in other embodiments less than 100 nm, and in other embodiments less than 75 nm. In one or more embodiments, adhesion layer 18 has a thickness of 100 nm or approximate thereto. In one or more embodiments, adhesion layer 18 has a thickness of from 50 nm to 200 nm, in other embodiments, from 1 nm to 75 nm, and in other embodiments, from 100 nm to 200 nm.

In one or more embodiments, functional layer 20 has a thickness of less than 3 micrometers, in other embodiments less than 2 micrometers, and in other embodiments less than 1 micrometer. In one or more embodiments, functional layer 20 has a thickness of 2 micrometers or approximate thereto. In one or more embodiments, functional layer 20 has a thickness of from 1 micrometer to 3 micrometers, and in other embodiments, from 0.5 micrometers to 2 micrometers.

In one or more embodiments, a gradient layer 22 has a thickness of less than 1 micrometer, in other embodiments less than 800 nm, and in other embodiments less than 500 nm. In one or more embodiments, a gradient layer 22 has a thickness of 900 nm or approximate thereto. In one or more embodiments, a gradient layer 22 has a thickness of from 800 nm to 1 micrometer, in other embodiments, from 100 nm to 500 nm, in other embodiments, from 100 nm to 1 micrometer, and in other embodiments, from 500 nm to 800 nm.

In one or more embodiments, coating 16 has a hardness equal to or greater than the hardness of the metal substrate 12 to which it is applied. In one or more embodiments, coating 16 has a hardness of 9 GPa or more, in other embodiments 10.5 GPa or more, and in other embodiments 12 GPa or more.

EXAMPLES

Comparative Example 1

A diamond-like carbon coating was applied to a first Ti-6Al-4V slide in the bolt carrier group of an AR-15 rifle. The diamond-like carbon coating consisted of a thin (about 100 nm) layer of chromium, a second layer (about 900 nm) layer of a tungsten carbide/amorphous hydrocarbon nanocomposite, and a top layer (about 2 micrometers) of a hard, amorphous hydrocarbon (also called diamond-like carbon). The coated slide was mounted in a bolt carrier group and then inserted into an AR-15. Over 300 rounds were fired in a semiautomatic mode. Then, the slide was removed and inspected. The coated slide showed visual signs of wear. The impact force from recoil was noticeably less.

Comparative Example 2

Separately, a nitride layer was applied to a second Ti-6Al-4V slide. The nitride layer was applied by placing it in a high temperature furnace with a partial pressure of nitrogen gas. This produced a nitride layer about 5 to 12 micrometers deep on the slide. This slide was then mounted in a bolt carrier group and inserted into an AR-15. Over 200 rounds were fired in a semiautomatic mode. Then, the slide was removed and inspected. The nitrogen treated slide showed visual signs of wear. The impact force from recoil was noticeably less.

Example 1

To a third Ti-6Al-4V slide, a nitride layer was applied as in comparative example 2, and then a diamond-like coating was also applied as in comparative example 1. This duplex treated slide was mounted in a bolt carrier group and then inserted into an AR-15. Over 3500 rounds were fired in both semiautomatic and automatic modes. Intermittently, the slide was removed and inspected. During and after the completed testing, the slide showed absolutely no sign of wear. Although the AR-15 is typically capable of firing about 900 rounds/minute in automatic mode with a steel slide, the AR-15 with the duplex treated, titanium alloy slide fired at a rate greater than about 1100 rounds/minute. The duplex treated titanium alloy slide was able to increase the rate of fire while also reducing weight, when compared to a steel component, and reducing recoil impact.

Additionally, the duplex treated titanium alloy slide was fired without any oil applied, and was cooled intermittently by removing from the firearm and dunking in a tank of water. Both of these activities are not recommended for steel slides.

Comparative Example 3

A high frequency reciprocating rig (HFRR) with the following properties was used: load of 3 N producing about 1 GPa of contact stress, temperature of 25° C., frequency of 20 Hz, and time of 20 minutes. The HFRR was used to test disc wear with a pin made from AISI 52100 material. AISI 52100 is a known alloy steel which contains carbon and chromium.

A disc made from Ti-6Al-4V had a wear rate of between $1.0 \times 10^{\wedge -3}$ mm$^3$/J and $1.0 \times 10^{\wedge -4}$ mm$^3$/J. A disc made from Ti-6Al-4V and having a nitride layer had a wear rate of between $1.0 \times 10^{\wedge -4}$ mm$^3$/J and $1.0 \times 10^{\wedge -5}$ mm$^3$/J.

Example 2

Using the same HFRR testing as above, a disc made from Ti-6Al-4V and having a nitride layer and an additional diamond-like carbon layer had a wear rate of between $1.0 \times 10^{\wedge -5}$ mm$^3$/J and $1.0 \times 10^{\wedge -6}$ mm$^3$/J.

Comparative Example 4

A steel bolt carrier was tested for corrosion resistance in an ASTM B117 salt spray environment. The steel bolt carrier exhibited corrosion after 8 hours.

Example 3

A bolt carrier made from Ti-6Al-4V and having a nitride layer and an additional diamond-like carbon layer was similarly tested for corrosion resistance in an ASTM B117 salt spray environment. The duplex treated Ti-6Al-4V bolt carrier achieved more than 1000 hours of exposure without showing any signs of corrosion.

In light of the foregoing, it should be appreciated that the present invention significantly advances the art by providing an improved surface treatment for a metal substrate. While particular embodiments of the invention have been disclosed in detail herein, it should be appreciated that the invention is not limited thereto or thereby inasmuch as variations on the invention herein will be readily appreciated by those of ordinary skill in the art. The scope of the invention shall be appreciated from the claims that follow.

What is claimed is:

1. A surface-treated substrate comprising a titanium alloy substrate, a nitrided titanium layer formed as a part of said titanium alloy substrate, and a diamond-like carbon coating on said nitrided titanium layer, wherein said nitrided titanium layer has a thickness of from 7 µm to 10 µm, and wherein said diamond-like carbon coating has a thickness of from 4 µm to 8 µm.

2. The surface treatment of claim 1, wherein said nitrided titanium layer has a hardness of from 300 HV to 1800 HV.

3. The surface treatment of claim 1, wherein said nitrided titanium layer has a hardness of 700 HV or more.

4. The surface treatment of claim 1, wherein said diamond-like carbon coating includes a gradient layer between an adhesion layer and a top functional layer, said adhesion layer being proximate said nitrided titanium layer, wherein the adhesion layer is made from chromium (Cr), titanium (Ti), tantalum (Ta), nickel (Ni), molybdenum (Mo), iron (Fe), silicon (Si), carbon (C), hydrogen (H), oxygen (O), and combinations thereof.

5. The surface treatment of claim 1, wherein said diamond-like carbon coating has a hardness of 9 GPa or more.

6. A coated metal substrate comprising a titanium-containing substrate having a nitrided titanium layer formed therein, and a diamond-like carbon coating on top of said nitrided titanium layer, wherein said titanium-containing substrate is a nickel titanium alloy.

7. The coated metal substrate of claim 6, wherein said titanium-containing substrate includes 50 wt. % or more titanium.

8. The coated metal substrate of claim 6, wherein said titanium-containing substrate includes 80 wt. % or more titanium.

9. The coated metal substrate of claim 6, wherein said titanium-containing substrate is represented by the formula $Ni_xTi_{1-x}$, where x is in a range of from 0.30 to 0.70.

10. The coated metal substrate of claim 9, where x is in a range of from 0.35 to 0.50.

11. The coated metal substrate of claim 6, wherein said titanium-containing substrate is selected from the group consisting of a slide in a bolt carrier, a knee replacement part, a hip replacement part, a gear, a crankshaft, a knife, and shears.

12. The coated metal substrate of claim 6, wherein said titanium-containing substrate is selected from the group consisting of a gun component and a medical device.

13. A method of making the coated metal substrate of claim 6 comprising steps of:
providing the titanium-containing substrate, introducing nitrogen to the titanium-containing substrate, to thereby react the nitrogen with the titanium of the nickel titanium alloy to thereby form the nitrided titanium layer within the titanium-containing substrate, and applying the diamond-like carbon coating to the nitrided titanium layer.

14. The method of claim 13, further comprising steps of placing the titanium-containing substrate in a furnace, reducing the pressure of the furnace, and increasing the temperature of the furnace to a treating temperature.

15. The method of claim 14, further comprising a step of holding the temperature of the furnace at the treating temperature.

16. The method of claim 15, further comprising a step of quenching the titanium-containing substrate with a nitrogen gas backfill.

17. The method of claim 14, further comprising a step of removing a contamination layer from the titanium-containing substrate.

18. The method of claim 17, wherein said step of removing a contamination layer includes providing a nitrogen gas flow to the titanium-containing substrate while heating the furnace to the treatment temperature.

* * * * *